United States Patent
Hsu et al.

(10) Patent No.: US 6,574,127 B2
(45) Date of Patent: Jun. 3, 2003

(54) SYSTEM AND METHOD FOR REDUCING NOISE OF CONGESTED DATALINES IN AN EDRAM

(75) Inventors: Louis L. Hsu, Fishkill; Rajiv V. Joshi, Yorktown Heights; David R. Hanson, Brewster, all of NY (US)

(73) Assignee: IBM Corporation, Armonk, NY (US)

( * ) Notice: Subject to any disclaimer, the term of this patent is extended or adjusted under 35 U.S.C. 154(b) by 0 days.

(21) Appl. No.: 09/820,592

(22) Filed: Mar. 29, 2001

(65) Prior Publication Data

US 2002/0141219 A1 Oct. 3, 2002

(51) Int. Cl.[7] .............................................. G11C 5/06
(52) U.S. Cl. ............................................. 365/63; 365/206
(58) Field of Search ........................................ 365/63, 206

(56) References Cited

U.S. PATENT DOCUMENTS

| | | | |
|---|---|---|---|
| 5,831,928 A | * 11/1998 | Nakano et al. | 365/233 |
| 6,097,209 A | 8/2000 | Fujimoto | 326/27 |
| 6,295,236 B1 | * 9/2001 | Brox et al. | 365/200 |

FOREIGN PATENT DOCUMENTS

JP 0250589 * 10/1987 ........... G11C/11/34

OTHER PUBLICATIONS

Betty Prince, "Semiconductor Memories", 1983, Wiley 2nd edition pp. 162–164.*
A 7F[2] Cell and Bitline Architecture Featuring Tilted Array Devices and Penalty–Free Vertical BL Twists for 4Gb DRAM's—2 pgs.

* cited by examiner

Primary Examiner—M. Tran
(74) Attorney, Agent, or Firm—Dilworth & Barrese, LLP

(57) ABSTRACT

A dataline wiring structural system is provided for an eDRAM which suppresses coupling and switching noise associated with datalines by providing a plurality of metal levels upon which the datalines are positioned. Each of the datalines carrying a differential signal includes at least one vertical twist in which the true and complementary signal components of the differential signal change position from the one metal level of the plurality of metal levels to another level.

26 Claims, 6 Drawing Sheets

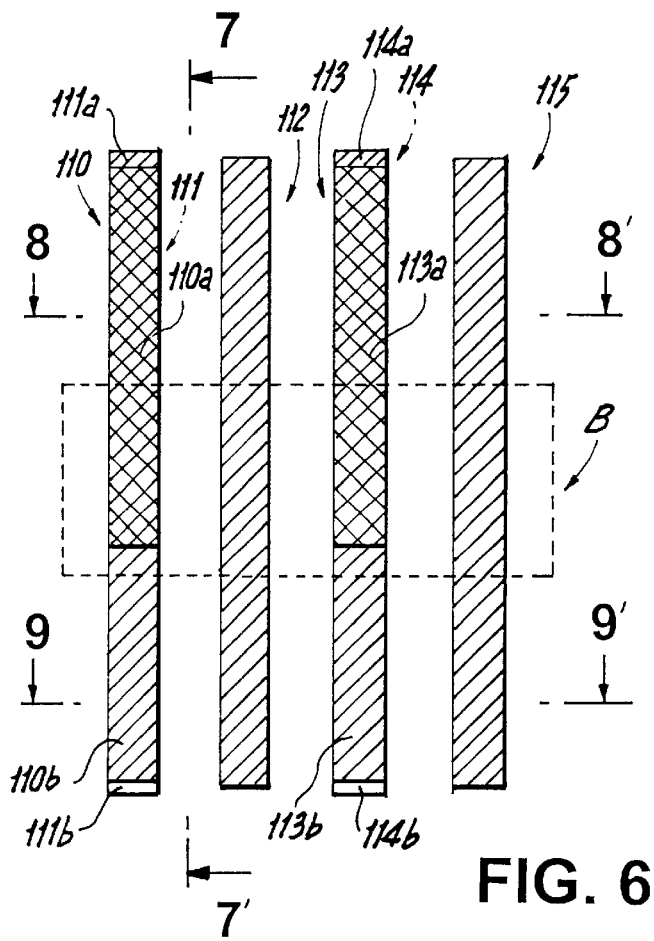 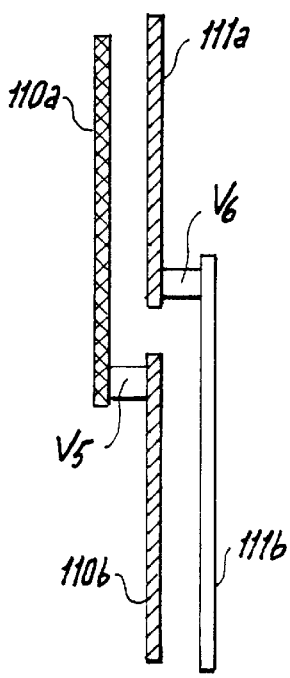
FIG. 6  FIG. 7
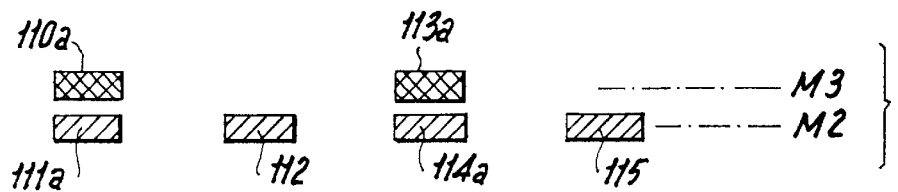
FIG. 8
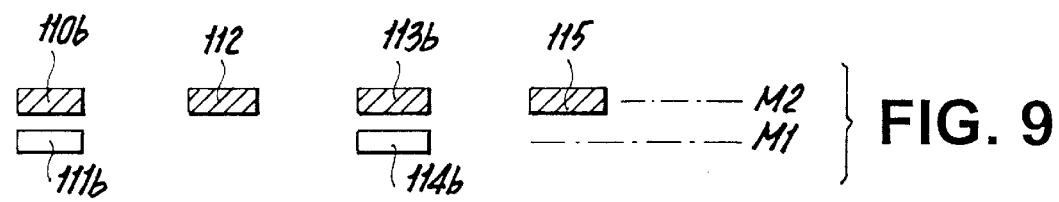
FIG. 9

SYSTEM AND METHOD FOR REDUCING NOISE OF CONGESTED DATALINES IN AN EDRAM

FIELD OF THE INVENTION

The invention relates to the field of integrated circuit design. Specifically, it relates to a system and method for reducing coupling and switching noise associated with datalines leading to and from an embedded memory, such as an embedded DRAM (eDRAM).

BACKGROUND OF THE INVENTION

Integrated circuit design of a microelectronic chip is generally aimed at reducing the size of components and connections/spacings between components, as well as increasing processing speed while maintaining the integrity of data signals. As technology develops, additional components are integrated on the chip resulting in an increased packing density for the microelectronic chip.

Typically, a high performance microprocessor chip uses a high-speed cache memory, for storing for example, instructions and data needed by a processor within the chip. The high-speed cache memory, referred to as the first level (L1) cache, is located proximate to the processor for maximizing efficiency and accuracy. Due to the size restriction of the cache, upon the occurrence of a data miss, the processor issues commands to get data from an off-chip main memory. A high data miss rate results in a significant performance penalty. To overcome the problem associated with data misses, a second level of cache memory (L2) is provided on the microprocessor chip for storing, for example, instructions and data needed by the processor.

The performance, such as in reliability and speed, of the cache memory is critical to the performance of the microprocessor chip. Cache memory is primarily made from static random access memory (SRAM) technology, such as a 6-transistor SRAM, which provides reliable performance. However, an SRAM cache memory is too large to integrate onto the microprocessor chip. SRAM also suffers alpha particle induced soft-error.

DRAM technology is typically four to ten times smaller than SRAM. However, conventional DRAM does not operate at speeds required for L2 cache memory. Technological developments have demonstrated an increase in the speed of DRAM with cycle times of 6 ns or less, thus making DRAM a suitable candidate for use in L2 cache memory.

A microprocessor chip, such as for a CPU, generally has a bandwidth of 64 to 256 bits. Embedded DRAM (eDRAM) providing the L2 cache of a microprocessor chip typically has a bandwidth of 256 bits for both incoming and outgoing buses. Accordingly, a typical eDRAM has 512 datalines.

The datalines must be packed physically as close as possible in order to fit onto the compact microprocessor chip and to occupy minimum space. In operation, the tightly packed datalines switch simultaneously, creating switching-associated noise and coupling noise that tends to affect the integrity of the data.

As technology develops wire widths (such as for datalines) and intervals are constantly being reduced for improving the packing density. A lower limit value is set to limit the thickness of the metal wire. Once the wire thickness is close to the lower limit value, the interval between the wire is reduced, while mutually opposing surface areas of wires are held constant. Thus, there is a tendency to increase capacitance between mutually neighboring wires causing an increase in coupling noise.

An illustration of a simplified layout of a portion of a prior art microprocessor chip is shown in FIG. 1. The portion includes an L2 cache memory 10 coupled to a CPU block 20. The CPU block 20 includes as an integer unit, a floating unit, a load store unit, L1 caches, etc., as known in the art.

Data retired by the CPU block 20 is stored temporarily in an incoming data register 80 of the CPU and is restored to the L2 cache 10 via outgoing datalines 60. Datalines 60 are received by secondary sense amplifier block 30 of the L2 cache and are eventually written back to the L2 cache 10.

Simultaneously, data stored in the L2 cache 10 are retrieved by the CPU block 20 through the secondary sense amplifier 30 via incoming datalines 50. The retrieved data is stored temporarily in an incoming data register 70 of the CPU block 20. Datalines 50 and 60 may be interleaved and are arranged in a compact space 40.

As data is transmitted simultaneously over datalines 50 and 60, coupling noise develops due to an up swing of adjacent dataline(s) as a dataline couples up adjacent dataline(s). Likewise, coupling noise develops due to a down swing of adjacent dataline(s) as a dataline couples down adjacent dataline(s). Furthermore, switching associated noise develops due to simultaneously switching a large number of electronic devices; such as data drivers, sense amplifiers, registers, buffers, etc. of the chip resulting in substrate and Vdd bouncing.

Several solutions exist for overcoming the switching-associated and coupling noise associated with the datalines of the L2 cache. One possible solution is to add a re-driver along the dataline to enhance the signal. A second possible solution is to add a coupling noise detector/eliminator device to minimize the coupling noise as disclosed in U.S. Pat. No. 6,097,209. These solutions require additional components which occupy additional space on the microprocessor chip. Hence, these solutions fail to reduce the size of the chip.

A third solution is to use differential signals for either or both outgoing and incoming datalines of the eDRAM. This causes a common rejection, thereby increasing dataline signal integrity. The use of differential signals has been applied to signal lines in which the signal lines are not as densely packed as the datalines of the microprocessor chip.

For example, in a DRAM array, bitline pairs carrying differential signals have been implemented using a bitline twist employing two metal levels in which one bitline of the pair is patterned on top of the other bitline of the pair. Coupling is canceled by providing alternating bitline pairs to have one twist point and remaining bitline pairs to have two twist points. Each bitline requires space laterally to accommodate the twist. The use of differential signals is not conducive for use in a very compact environment as is the case for the ingoing and outgoing datalines of the high-density, wide bandwidth eDRAM.

Accordingly, a need exists for a system and method for reducing noise due to congested datalines in an eDRAM.

SUMMARY

An aspect of the present invention is to provide a system and method for reducing noise due to congested datalines in an eDRAM.

Another aspect of the present invention is to provide a dataline wiring structural system using differential signals for use in a compact eDRAM environment.

Further, a not her aspect of the present invention is to provide a dataline wiring structural system for reducing coupling and switching associated noise without consuming additional space on a microelectronic chip.

Further still, another aspect of the present invention is to provide a dataline wiring structural system using differential signals for outgoing datalines only, for incoming datalines only, and outgoing and incoming datalines without consuming extra space on a microprocessor chip.

Accordingly, the present invention provides a dataline wiring structural system for an eDRAM on a microelectronic chip that suppresses coupling and switching-associated noise associated with incoming and outgoing datalines by providing a plurality of metal levels upon which the datalines are positioned. At least one of the datalines carries a differential signal. The outgoing datalines are interleaved with the incoming datalines. Each of the differential datalines includes at least one vertical twist in which the true and complementary signal components of the differential signal change position from one metal level of the plurality of metal levels to another level.

In a first embodiment of the present invention, the datalines of the incoming or the outgoing datalines carry a differential signal, while the other of the incoming or outgoing datalines carries a single-ended signal. Two metal levels are provided, a first metal level and a second metal level, above the first metal level. The single-ended signal dataline is positioned on the second metal level. For each differential signal dataline, at least one vertical twist is provided so that each of the true and complementary components of the differential signal changes position between the first and second metal levels. Electrical connectors are provided for facilitating the change of levels associated with each of the vertical twists.

In a second embodiment, a third metal level is provided above the second metal level. Each vertical twist is accomplished by changing positions of the true and complementary components between the three metal levels. For each vertical twist, the differential signal is positioned in a single vertical plane. In a third embodiment, both of the incoming and outgoing datalines carry differential signals. Three metal levels are provided for positioning the true and complementary components of the differential signals thereon.

BRIEF DESCRIPTION OF THE FIGURES

FIG. 6 is a top view schematic diagram of an eDRAM dataline wiring structural system according to a second embodiment of the present invention;

FIG. 7 is a cross-sectional diagram of FIG. 6 taken along line 7–7';

FIG. 8 is a cross-sectional diagram of FIG. 6 taken along line 8–8';

FIG. 9 is a cross-sectional diagram of FIG. 6 taken along line 9–9';

DETAILED DESCRIPTION OF THE MENTION

Figure 1:
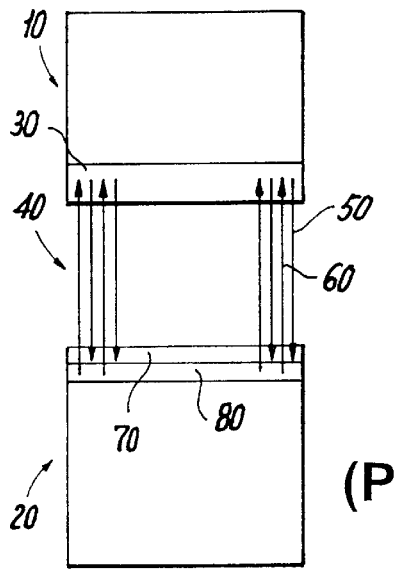
FIG. 1 is a schematic diagram of a prior art eDRAM.
Figure 2A:
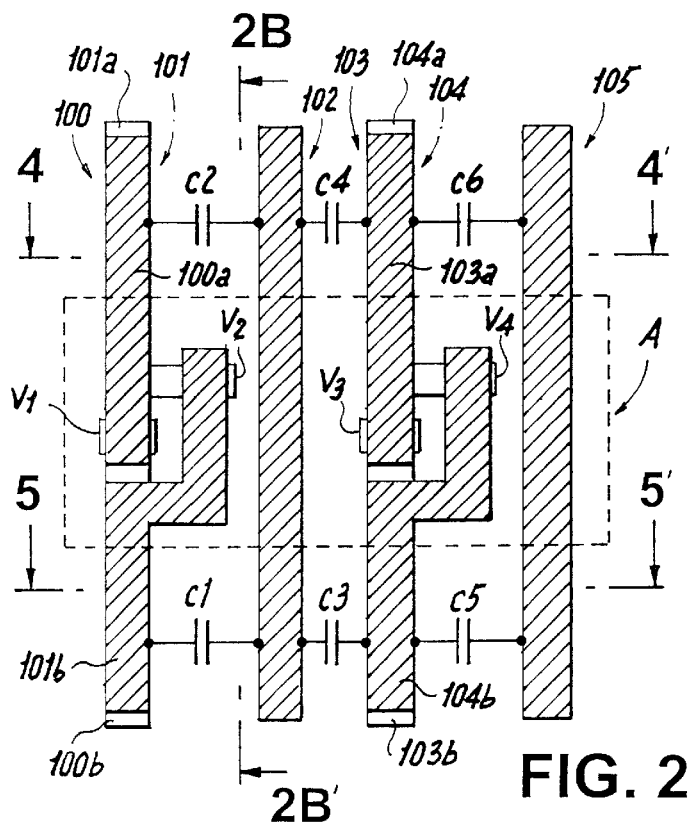
FIG. 2A is a top view schematic diagram of an eDRAM dataline wiring structural system according to a first embodiment of the present invention.

A first embodiment of a dataline wiring structural system according to the present invention is shown by FIGS. 2A–5. FIG. 2A shows a layout of outgoing and incoming datalines of an L2 cache. FIG. 2B shows a cross sectional view of an outgoing dataline. The outgoing datalines from a data register block of a CPU are provided with differential signals, while the incoming datalines retrieved from a secondary sense amplifier of the L2 cache have single-ended signals. The differential signals of the outgoing datalines are provided by drivers from the data registers of the CPU block without requiring additional hardware.

An advantage of requiring only single-ended signals for incoming datalines is use of a small sense amplifier, such as a direct sensing sense amplifier, relative to a sense amplifier providing differential signals, such as a cross-coupled differential sense amplifier, for the secondary sensing amplifier, thus conserving space. An additional advantage for using a small sense amplifier, such as a direct sensing sense amplifier, is to increase speed. Any noise associated with the small sense amplifier is canceled by the vertical twist configuration of the inventive dataline wiring structural system.

Figure 3:
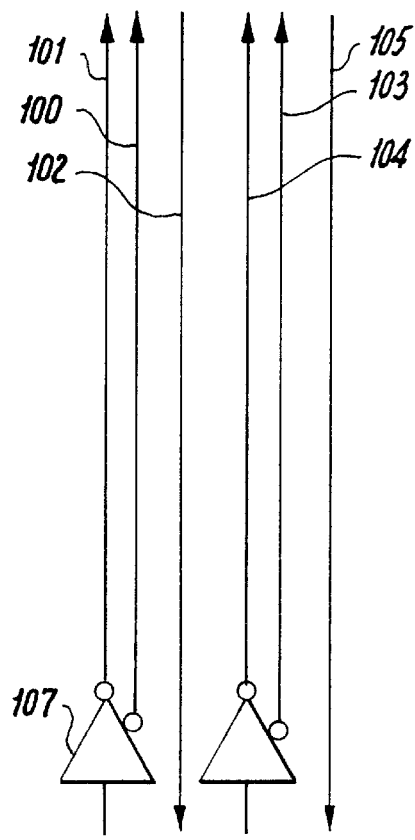
FIG. 3 is a schematic diagram of the datalines according to the first embodiment of the present invention.

Referring to FIG. 3, outgoing datalines formed into signal pairs along wires 100, 101 and 103, 104 are provided from drivers 107. Incoming datalines formed as single-ended signals along wires 102, 105, are interleaved between the outgoing datalines. The dataline wires are formed on two metal levels, a first metal level, M1, and a second metal level, M2, positioned above the first metal level M1.

A single twist provided along the wires of each signal pair cancels coupling noise caused by parasitic capacitance formed between the signal pair wires and an adjacent single-ended signal wire to either side of the signal pair wires. Referring back to FIG. 2A, a single vertical twist is provided for each of the outgoing dataline signal pair wires 100,101 and 103,104. As seen in FIG. 2A, Box A, a minimal penalty area is needed to accommodate the twist of the outgoing dataline wires. Since the single-ended incoming datalines 102, 105 are not provided with a twist, there is no penalty area associated with the incoming data signal wires. Thus, a minimum penalty area is associated with only half of the dataline wires.

As seen in FIGS. 2A, 2B, 4 and 5, the twist is accomplished by using the two metal levels M1 and M2 along which the signal pair wires 100, 101 and 103, 104 are positioned. The M1 metal level is positioned in a first plane, and the M2 metal level is positioned in a second plane, wherein the planes are preferably horizontal. The M2 metal level wire is represented by crosshatched lines, and the M1 metal level wire is represented by no hatched lines.

Figure 4:
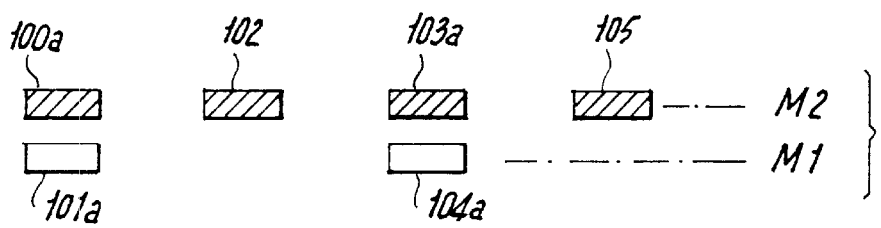
FIG. 4 is a cross-sectional diagram of FIG. 2A taken along line 4–4'.
Figure 5:
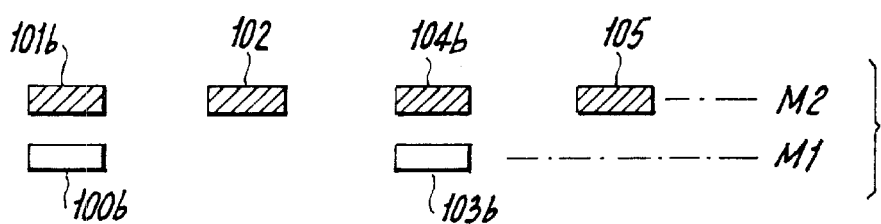
FIG. 5 is a cross-sectional diagram of FIG. 2A taken along line 5–5'.
Figure 10:
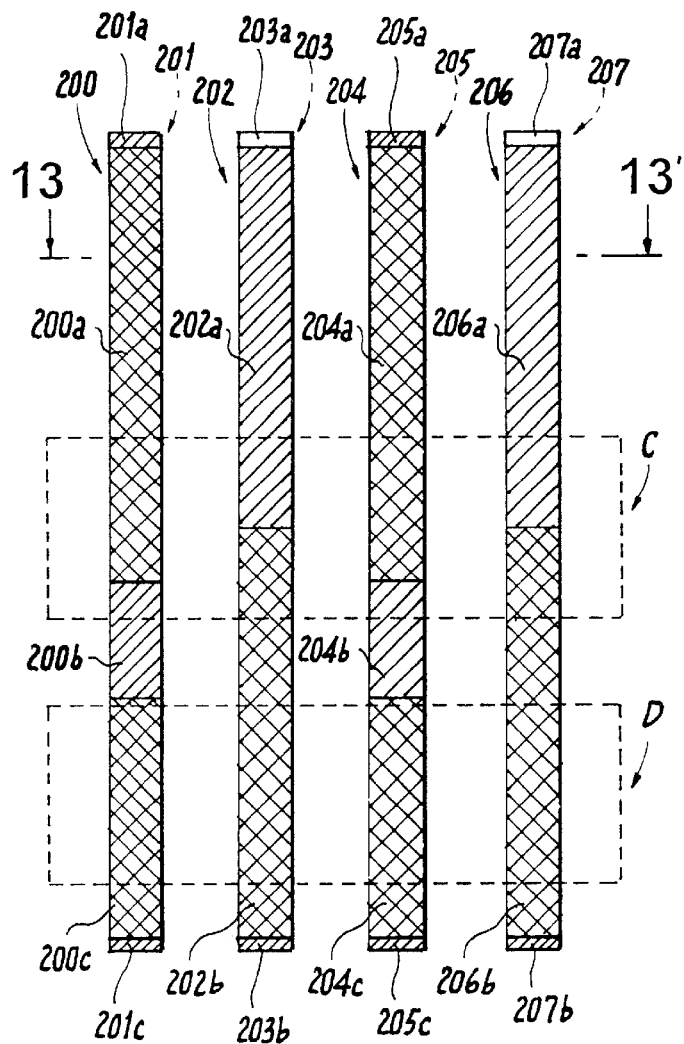
FIG. 10 is a top view schematic diagram of an eDRAM dataline wiring structural system according to a third embodiment of the present invention.

At a first end of each signal pair wire, shown in cross section across line 4–4' in FIG. 4, the complement signal wires 100 and 103 are positioned at the second metal level M2 and the true signal wires 101, 104 of each signal pair are positioned at the first metal level M1. At the other end of each signal pair wire, shown in cross section across line 5–5' in FIG. 5, the true signal wires 101, 104 are positioned at the second metal level M2, and the complement signal wires 100, 103 are positioned at the first metal level M1. The signal pair wires change levels via vertical electrical connections, such as metal contact studs, also known as vias.

Figure 2B:
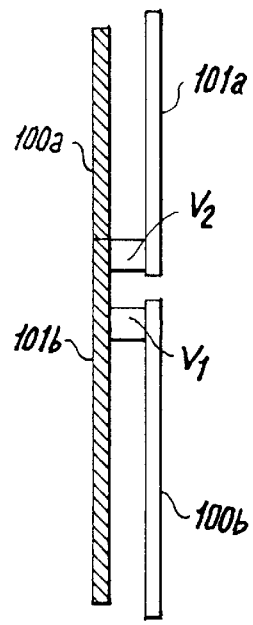
FIG. 2B is a cross-sectional diagram of FIG. 2A taken along line 2B–2B'.

Referring to FIGS. 2A and 2B, portion 100a of complementary signal wire 100 is positioned on metal level M2. At via V1, signal wire 100 changes levels to metal level M1. Portion 100b of complementary signal wire 100 is positioned on metal level M1. Likewise, portion 103a of complementary signal wire 103 is positioned on metal level M2. At via V3, signal wire 103 changes levels to metal level M1. Portion 103b of complementary signal wire 103 is positioned on metal level M1. In the same manner, portion 101a of true signal wire 101 is positioned on metal level M2.

At via V2, signal wire 101 changes levels to metal level M1. Portion 101b of true signal wire 101 is positioned on metal level M1. Likewise, portion 104a of true signal wire 104 is positioned on metal level M2. At via V4, signal wire 104 changes levels to metal level M1. Portion 104b of true signal wire, 104 is positioned on metal level M1.

As shown in FIG. 2A, the true signal wires 100, 103 are generally straight from one end to the other, and the complementary signal wires 101, 104 project slightly in a lateral direction from the position of the true signal wires 100, 103. The lateral projection of the outgoing dataline wire is the slight area penalty occupied by the twist of the eDRAM in the first embodiment. The penalty area can be kept to a minimum by applying a staggering technique to the layout of the vias. The incoming single-ended datalines do not occupy any penalty area.

The single twist of the outgoing dataline wiring structural system of the first embodiment is sufficient to cancel coupling and switching noise associated with the datalines. Parasitic (i.e., stray) capacitance, responsible for the coupling noise associated with adjacent outgoing and incoming datalines is shown in FIG. 2A as C1–C6.

With the present invention, the net noise coupling effect due to parasitic capacitance is zero. Upon an upswing of one of the datalines 100–105, an adjacent dataline is typically coupled up through one of the parasitic capacitors. However, due to the opposing voltage level of the signal pairs of the outgoing datalines, there is an equivalent virtually simultaneous coupling down through another one of the parasitic capacitors. This results in a minimal net coupling noise for the system.

For example, upon an upswing of the true outgoing data signal wire 100, adjacent incoming signal wire 102 is coupled up through capacitor C2. However, complementary outgoing data signal wire 101 swings down and couples down the same incoming data signal wire 102, through capacitor C1 virtually simultaneously. The coupling via C1 cancels coupling via C2 and the net capacitive coupling is zero. Similarly, an upswing of the incoming data signal along wire 102 virtually simultaneously couples up the wires 100, 101 of both the true and complementary signals of the adjacent outgoing dataline, resulting in a net capacitance coupling of zero.

Coupling noise is developed between the datalines and the substrate of the microelectronic chip when the datalines are physically very close to the substrate, such as when the datalines are positioned at the lowest metal level, e.g. M1. The coupling noise is canceled due to the opposing up and down swings of the true and complementary signals of the outgoing datalines proximate to the substrate at metal level M1.

Stable power lines such as Vdd and ground lines may be included in the dataline wiring structural system of the first embodiment by replacing incoming datalines, such as wires 102, 105, with Vdd and ground lines at specific intervals, such as for every fourth incoming dataline. Coupling noise associated with Vdd bounce and ground bounce is ideally canceled. For example, the coupling of an adjacent Vdd or ground line due to an upswing of an outgoing dataline wire, such as wire 101, would be canceled due to the associated down swing of the signal wire 100.

A second embodiment of a dataline wiring structural system according to the present invention is shown by FIGS. 6–9 in which a third metal level M3 positioned in a third plane, preferably horizontal, above the second metal level M2 is provided for positioning the signal wire and forming the vertical twist. The incoming datalines are formed on the second metal level M2, and the outgoing datalines are formed using the three metal levels M1, M2 and M3. As seen in FIGS. 6–9, the M3 metal level wire is represented by double crosshatched lines, the M2 metal level wire is represented by crosshatched lines, and the M1 metal level wire is represented by no hatched lines.

At a first end of each signal wire pair, shown in cross section across line 8–8' in FIG. 8, the complement signal wires 111, 114 are positioned at the second metal level M2 and the true signal wires 110, 113 of each signal wire pair are positioned at the third metal level M3. At the other end of each signal pair wire, shown in cross section across line 9–9' in FIG. 9, the true signal wires 110, 113 are positioned at the second metal level M2, and the complement signal wires 111, 114 are positioned at the first metal level M1.

In FIG. 7, a cross-sectional view taken along line 7–7' of FIG. 6 shows an incoming dataline including a true signal wire 110 and a complementary signal wire 111 formed on metal levels M1, M2 and M3. FIGS. 8 and 9 show cross sectional views taken along line 8–8' and line 9–9', respectively, to further illustrate the level changes of the outgoing datalines.

From top down in FIG. 7, portion 110a of true signal wire 110 is positioned on metal level M3. At via V5, signal wire 110 changes levels to metal level M2. Portion 110b of true signal wire 110 is positioned on metal level M2. Likewise, portion 113a of true signal wire 113 is positioned on metal level M3 (FIG. 8). Similarly to signal wire 110, at a via (not shown), signal wire 113 changes levels to metal level M2. Portion 113b of true signal wire 113 is positioned on metal level M2 (FIG. 8). In the same manner, portion 111a of complementary signal wire 111 is positioned on metal level M2. At via V6, signal wire 111 changes levels to metal level M1. Portion 111b of complementary signal wire 111 is positioned on metal level M1 (FIG. 9). Likewise, portion 114a of complementary signal wire 114 is positioned on metal level M2 (FIG. 8). Similarly to signal wire 111, signal wire 114 changes levels to metal level M1 at another via (not shown). Portion 114b of complementary signal wire 114 is positioned on metal level M1 (FIG. 9).

As shown in FIG. 6, Box B, the vertical twist of the second embodiment does not take up any penalty area since it does not occupy any lateral space for the outgoing or the incoming datalines. Furthermore, in the upper portion of FIGS. 6 and 7, M1 is not shown, and in the lower portion of FIG. 6, M3 is not shown, since only the metal levels upon which a dataline is formed are shown. M1 and M3 can be used at the stated portions, for example, where a dataline is not formed thereupon for other purposes of interconnection (horizontally, for example).

In a preferred embodiment, the differential signal lines are provided with an odd number of vertical twists for a proper length of dataline. Furthermore, in a preferred embodiment multiple contacts are provided in each twist area to avoid excessive contact resistance. A single contact may result in high contact resistance if, for example, the contact is not fully opened. Therefore dual contacts will improve the contact resistance.

As in the first embodiment, the net coupling noise caused by parasitic capacitance is zero in accordance with common rejection. For example, referring to FIG. 6 in a top to bottom fashion, as 111a swings up at the upper portion of the M2 metal level, 110b swings down at the lower portion of the M2 metal level. The coupling effect to the adjacent incoming dataline 112 formed on the M2 level is thus canceled, resulting in a zero coupling noise. Similarly, an upswing of the incoming data signal along wire 112 simultaneously couples up the wire portions 110b, 111a of both the true and complementary signals of the adjacent outgoing dataline, resulting in a zero coupling noise.

In general, the switching noise involves the switching of many devices simultaneously. A wide I/O data bus is typically accompanied with many data drivers switching at the same time. When this happens, ground/Vdd bounce are expected. This bounce will affect the datalines by coupling. With the arrangement of the present invention, the coupling between Vdd, ground (substrate), and the datalines should all be canceled out. Therefore, switching noise is a secondary effect. The arrangement of the present invention will also overcome the switching problem by self-cancellation due to dataline twisting. Switching associated noise with Vdd bounce and ground bounce is canceled as well. For example, the coupling of an adjacent Vdd or ground line due to an upswing of an outgoing dataline wire, such as wire 111, is canceled due to the associated downswing of the signal wire 110.

In the first and second embodiments it is possible to configure the eDRAM datalines so that the incoming signals carry differential signals and the outgoing signals carry single-ended signals. For example, in FIG. 2 signal wires 100, 101 would be complementary and true signal wires for an incoming dataline and signal wire 102 would be a single-ended signal wire for an outgoing dataline. Similarly, in FIG. 6, signal wires 110, 111 would be complementary and true signal wires for an incoming dataline, and signal wire 112 would be a single-ended signal wire for an outgoing dataline. The cancellation of coupling and switching associated noise would be the same as for the first and second embodiments discussed above.

In a third embodiment of a dataline wiring structural system according to the present invention, both the outgoing and incoming datalines carry differential signals, and multiple metal levels are used upon which to form the true and complementary lines associated with each outgoing and incoming dataline. One set of the outgoing and incoming datalines is provided with two twists and the other set is provided with three twists. There is no penalty area associated with the twists. The coupling noise and switching associated noise with the datalines is canceled.

Figure 11:
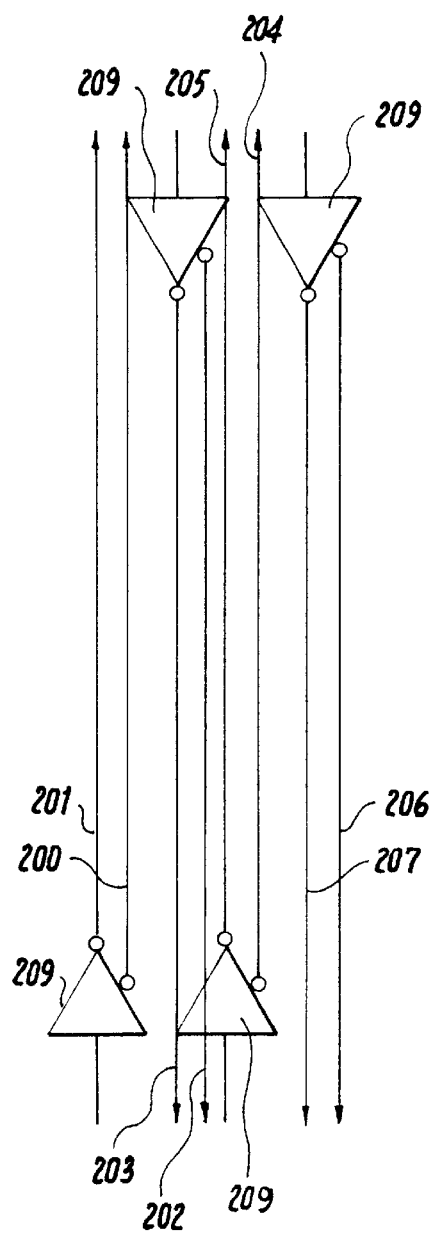
FIG. 11 is a schematic diagram of the datalines according to the third embodiment of the present invention.

The third embodiment is shown by FIGS. 10–13. As shown in FIG. 11, data drivers 209 are provided to provide differential signals for incoming and outgoing datalines. Both the outgoing and ingoing datalines are formed using the three metal levels M1, M2, and M3, wherein each of the metal levels M1, M2 and M3 are preferably positioned in a single horizontal plane. At FIG. 13, the cross section of the dataline wire layout taken along line 13–13' is shown to further illustrate the multiple levels of the ingoing and outgoing datalines.

Figure 12:
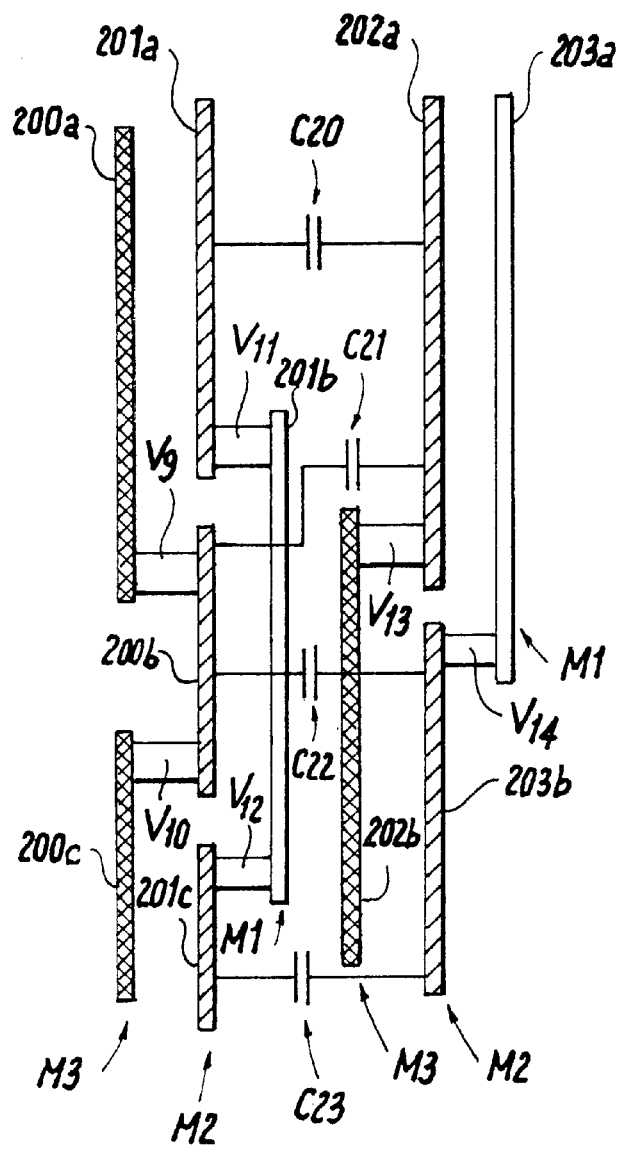
FIG. 12 is a partial perspective view of the third embodiment of the present invention.
Figure 13:
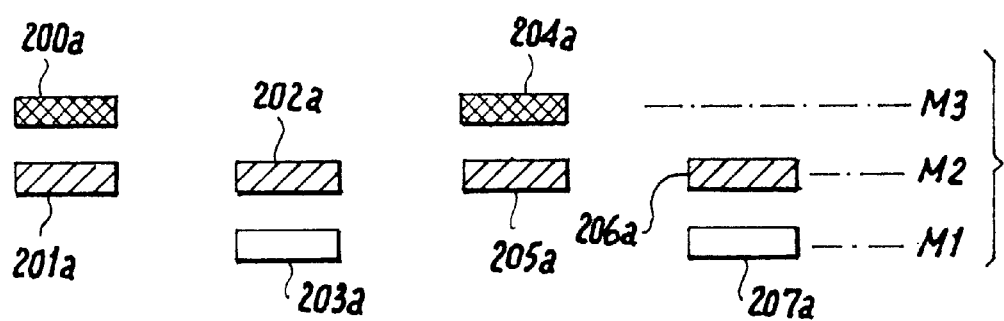
FIG. 13 is a cross-sectional diagram of FIG. 10 taken along line 13–13'.

In FIG. 12, a partial perspective view is shown of the changing of levels of the true and complementary wires 201, 200 of one of the outgoing datalines and of the true and complementary wires 203, 202 of one of the incoming datalines. Portion 200a of complementary outgoing wire 200 is formed on metal level M3, connects at via V9 to portion 200b formed on metal level M2 and connects at via V10 to portion 200c formed on metal level M3.

Portion 201a of true outgoing wire 201 is formed on metal level M2, connects at via V11 to portion 201b formed on metal level M1 and connects at via V12 to portion 201c formed on metal level M2.

Portion 202a of incoming complementary wire 202 is formed on metal level M2 and connects at V13 to portion 202b formed on metal level M3. Portion 203a of incoming wire 203 is formed on metal level M1 and connects at V14 to portion 203b formed on metal level M2.

The vertical twist shown in FIGS. 10–13 is exemplary. For effective cancellation of coupling noise, in a given eDRAM each set of incoming datalines of the eDRAM has an odd number of twists and each set of outgoing datalines of the eDRAM has an even number of twists, and vice versa.

The net coupling noise of the third embodiment is canceled. For example, when the true outgoing wire 201 at portion 201a couples up complementary incoming wire 202 at portion 202a via capacitor C20, then complementary outgoing wire 200 at portion 200b couples down complementary incoming wire 202 at portion 202b through capacitor C21, so that the net capacitance of C20 and C21 is zero. Similarly, when complementary outgoing wire 200 at portion 200b couples down true incoming wire 203 at portion 203b via C22, then true outgoing wire 201 at portion 201c couples down true incoming wire 203 at portion 203b via C23, so that the net capacitance of C20 and C21 is zero.

It is appreciated that one skilled in the art can recognize other instances of coupling along the metal levels M1, M2 and M3, and that each instance of coupling is canceled by a corresponding coupling, so that the net capacitive coupling noise is zero.

Figure 14A:
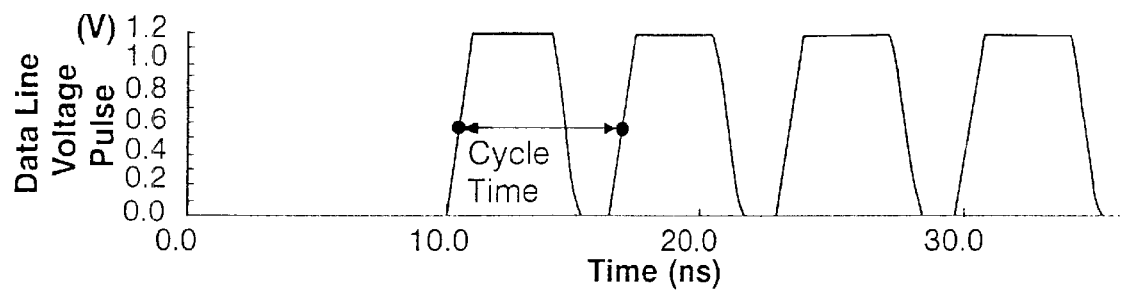
FIG. 14A is a graph of voltage levels of a switching dataline of an eDRAM.
Figure 14B:
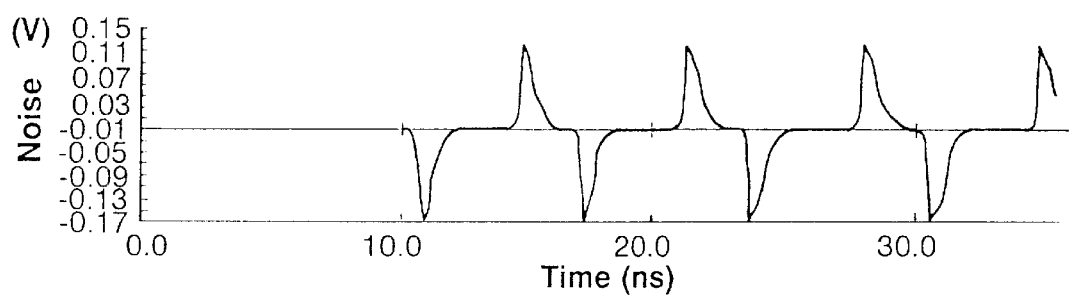
FIG. 14B is a graph of voltage levels of coupling noise associated with a dataline of an EDRAM using a prior art dataline wiring system.
Figure 14C:
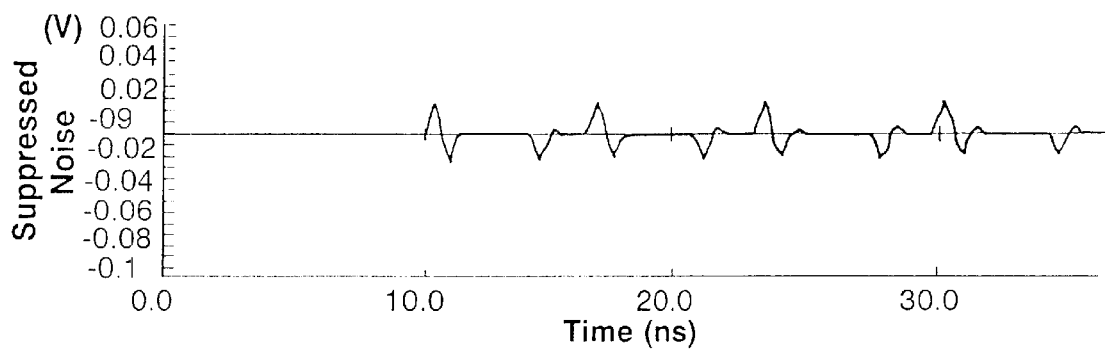
FIG. 14C is a graph of voltage levels of coupling noise associated with a dataline of an EDRAM using a dataline wiring structural system in accordance with the present invention.

FIGS. 14A–C illustrate results of a simulation test performed for measuring coupling noise associated with datalines of an eDRAM. FIG. 14A shows the voltage level of a dataline of an eDRAM, and FIGS. 14B and 14C show coupling noise (magnitude) associated with the dataline of FIG. 14A. The dataline width and space between adjacent datalines are both approximately 0.25 um, the signal cycle time is 6.6 nanoseconds, and the datalines are about 1500 um long. A dataline from a first set of one of the sets of incoming or outgoing datalines is switched at a frequency of 150 MHZ from 0 to 1.2 V. FIG. 14B shows worst case coupling noise associated with a dataline from the other set of outgoing and incoming datalines of a conventional eDRAM. Worst case coupling noise refers to noise associated with a dataline from one set of datalines that is sandwiched between two datalines from the other set of datalines. The measured coupling noise is shown to peak at approximately +150 mV and 170 mV.

FIG. 14C shows worst case coupling noise associated with a dataline from the other set of outgoing and incoming datalines of an eDRAM in accordance with each of the three embodiments of the present invention. The measured coupling noise is shown to be suppressed to less than +/−15 mV, thereby achieving a ten-fold improvement in noise reduction as compared to a conventional eDRAM.

The third embodiment is useful for eDRAM configurations in which it is desirable to have differential signals for both sets of incoming and outgoing signals. In other configurations, the second embodiment may be preferable due the option to use a smaller second sense amplifier for providing a single-ended signal, and due to the available metal levels M1, M2, M3 at locations where the metal levels are unused.

It is provided that the space between the datalines in the embodiments discussed above is in the range of 0.08 to 0.25 um.

It is contemplated that the plurality of datalines may include any combination and layout of incoming and outgoing datalines, and that differential and single-ended signals may be carried by any combination of incoming and outgoing datalines. It is also contemplated that the metal levels may be formed in a variety of shapes and configurations. It is further contemplated that the incoming and outgoing datalines may switch between any combination of the first, second and third metal levels.

What has been described herein is merely illustrative of the application of the principles of the present invention. For example, the functions described above and implemented as the best mode for operating the present invention are for illustration purposes only. Other arrangements and methods may be implemented by those skilled in the art without departing from the scope and spirit of this invention.

What is claimed is:

1. A dataline wiring structural system for an embedded DRAM (eDRAM) comprising a plurality of datalines which include a plurality of incoming datalines and a plurality of outgoing datalines, wherein at least one of the plurality of datalines is positioned on at least two metal levels, at least one of the plurality of datalines carries a differential signal, and the plurality of incoming datalines are interleaved with the plurality of outgoing datalines.

2. The system according to claim 1, wherein the space between adjacent datalines of the plurality of datalines is from 0.08 to 0.25 um.

3. The system according to claim 1, wherein a first metal level is formed on a first plane, and a second metal level is formed on a second plane.

4. The system according to claim 1, wherein a first set of datalines of the plurality of datalines carries a differential signal, and a second set of datalines of the plurality of datalines carries a single-ended signal.

5. The system according to claim 1, wherein at least one of the outgoing and at least one of the incoming datalines carries a differential signal.

6. The system according to claim 1, wherein the at least one of the plurality of datalines carries a differential signal via a signal wire pair, and wherein at least one signal wire of the signal wire pair switches from the first plane to the second plane.

7. The system according to claim 1, wherein one of the plurality of datalines carries a single-ended signal on one of the first plane and second plane.

8. The system according to claim 1, wherein the at least one of the plurality of datalines switches from the second plane to a third plane.

9. The system according to claim 8, wherein the at least one of the plurality of datalines switches from the second plane to the third plane via a twist configuration.

10. The system according to claim 8, wherein a third metal level is formed on the third plane.

11. The system according to claim 1, wherein the at least one of the plurality of datalines switches from a first metal level to a second metal level.

12. The system according to claim 1, wherein the at least one of the plurality of datalines switches from the first plane to the second plane via a twist configuration.

13. The system according to claim 1, wherein the at least one of the plurality of datalines includes at least two portions, wherein a first portion is located prior to switching and a second portion located after switching, and wherein the first and second portions are oriented in the same direction.

14. The system according to claim 13, wherein the first portion and second portion are oriented in the same direction throughout.

15. The system according to claim 1, wherein the at least one of the plurality of datalines includes a first portion and a second portion, wherein the first portion is located on the first plane, and the second portion is located on the second plane, and wherein a switching point for switching from the first plane to the second plane is located at a distal end of the first portion and at a proximal end of the second portion.

16. A method for reducing noise in an eDRAM comprising the steps of:

providing a plurality of datalines including a plurality of incoming datalines and a plurality of outgoing datalines;

switching at least one of the plurality of datalines from a first plane to a second plane; and interleaving the plurality of incoming datalines with the plurality of outgoing datalines.

17. The method according to claim 16, further comprising the step of forming a first metal level on the first plane and second metal level on the second plane.

18. The method according to claim 16, further comprising the steps of:

carrying a differential signal via one of the plurality of datalines; and carrying a single-ended signal via another of the plurality of datalines.

19. The method according to claim 16, further comprising the step of carrying a differential signal via the at least one of the plurality of datalines.

20. The method according to claim 16, further comprising the step of switching the at least one of the plurality of datalines from the second plane to a third plane, wherein a third metal level is provided on the third plane.

21. The method according to claim 16, further comprising the steps of:

coupling a first portion of the at least one of the plurality of datalines to a second portion of the at least one of the plurality of datalines at a switching point;

providing the first portion on the first plane; and providing the second portion on the second plane.

22. The method according to claim 21, further comprising the step of orienting the first and second portions in the same direction throughout.

23. The method according to claim 16, wherein the step of providing includes the step of spacing the plurality of datalines from 0.08 to 0.25 um apart.

24. A dataline wiring structural system for an embedded DRAM (eDRAM) comprising a plurality of datalines wherein at least one of the plurality of datalines carries a differential signal and at least one of the plurality of datalines carries a single-ended signal.

25. The system in accordance with claim 24, wherein the at least one of the plurality of datalines carrying the differential signal includes a signal wire pair, wherein the signals wires of the signal wire pair lie in different planes.

26. A dataline wiring structural system for an embedded DRAM (eEDRAM) comprising a plurality of datalines configured for carrying differential signals, the plurality of datalines including a plurality of incoming datalines and a plurality of outgoing datalines interleaved with the plurality of incoming datalines, wherein each of said plurality of datalines includes two wires switching from a first plane to a second plane.

* * * * *